United States Patent
Sahara et al.

(10) Patent No.: US 6,713,880 B2
(45) Date of Patent: Mar. 30, 2004

(54) SEMICONDUCTOR DEVICE AND METHOD FOR PRODUCING THE SAME, AND METHOD FOR MOUNTING SEMICONDUCTOR DEVICE

(75) Inventors: Ryuichi Sahara, Hirakata (JP); Hiroaki Fujimoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/066,650

(22) Filed: Feb. 6, 2002

(65) Prior Publication Data

US 2002/0105094 A1 Aug. 8, 2002

(30) Foreign Application Priority Data

Feb. 7, 2001 (JP) .......................... 2001-030577

(51) Int. Cl.⁷ .................. H01L 23/48; H01L 23/52; H01L 29/40
(52) U.S. Cl. .................. 257/783; 257/784; 257/781
(58) Field of Search .................. 257/782, 783, 257/781, 784, 780, 778

(56) References Cited

U.S. PATENT DOCUMENTS

| 6,034,437 A | * | 3/2000 | Shhibata |
| 6,054,773 A | * | 4/2000 | Ohsawa et al. |
| 6,107,678 A | * | 8/2000 | Shigata et al. |
| 6,246,114 B1 | * | 6/2001 | Takahashi et al. |
| 6,320,250 B1 | * | 11/2001 | Takahashi et al. |

FOREIGN PATENT DOCUMENTS

| EP | 0 991 119 A1 | 4/2000 |
| JP | 5-41407 A | 2/1993 |
| JP | 10-32307 | 2/1998 |
| JP | 11-307694 A | 11/1999 |
| JP | 2000-36506 A | 2/2000 |
| JP | 2001-7252 A | 1/2001 |
| WO | WO 99/04430 | 1/1999 |

* cited by examiner

*Primary Examiner*—Sheila V. Clark
(74) *Attorney, Agent, or Firm*—McDermott, Will & Emery

(57) ABSTRACT

A semiconductor device includes a semiconductor chip, an insulating layer formed on a region excluding the plurality of electrode pads on the principal surface of the semiconductor chip, a plurality of contact pads arranged on the insulating layer, a wiring layer electrically connected to at least one of the plurality of electrode pads and electrically connected to at least one of the plurality of contact pads, thereby establishing rewiring connection, an insulative resin layer formed on a region excluding the plurality of contact pads on the principal surface of the semiconductor chip, a protruded electrode provided on each of the plurality of contact pads, and an underfill material layer provided on the insulative resin layer in such a manner that the top of the protruded electrode is exposed.

12 Claims, 10 Drawing Sheets

SEMICONDUCTOR DEVICE AND METHOD FOR PRODUCING THE SAME, AND METHOD FOR MOUNTING SEMICONDUCTOR DEVICE

BACKGROUND OF THE INVENTION

The present invention relates to a semiconductor device and a method for producing the same, and a method for mounting a semiconductor device. In particular, the present invention relates to a semiconductor device in the form of a chip that can increase the efficiency of mounting on a wiring substrate, allows high-density mounting, and can realize highly reliable substrate mounting, and a method for producing the same, and a method for mounting a semiconductor device. The present invention also relates to a semiconductor device in which electrode pads for external terminals are rewired on a semiconductor chip, and the external terminals are arranged two-dimensionally and a method for producing the same, and a method for mounting a semiconductor device.

In recent years, high-density mounting of a semiconductor package having a lead terminal as its external terminal has been promoted with the development of light-weighted, compact and high-density portable equipment. Under these circumstances, for higher density mounting, a technique for mounting a semiconductor device in the form of a chip on a wiring substrate of electronic equipment has been developed.

Hereinafter, a conventional semiconductor device that is mounted on a wiring substrate and a method for mounting a semiconductor will be described with reference to the accompanying drawings.

FIG. 9 schematically shows a cross-sectional structure of a conventional semiconductor device, and the semiconductor device shown in FIG. 9 is a semiconductor device in the form of a chip used for bare chip mounting. The semiconductor device includes a semiconductor chip 1 including a semiconductor integrated circuit inside its upper surface, and electrode pads (not shown) electrically connected to the semiconductor integrated circuit are provided on the semiconductor chip 1. Protruded electrodes 2 are formed on the electrode pads (not shown).

The protruded electrodes 2 are formed in the peripheral portion of the semiconductor chip 1 to constitute external terminals for electrical connection to the outside. The protruded electrodes 2 are made of conductive metal protrusion such as bumps and solder balls. Although not shown, an insulating layer is formed on a region excluding the electrode pads on the upper surface of the semiconductor chip 1.

Next, referring to FIGS. 10A to 10C, a conventional method for mounting a semiconductor device will be described.

To mount the semiconductor device as shown in FIG. 9 on a wiring substrate, first, a wiring substrate 3 such as a printed substrate to be incorporated into electronic equipment is prepared. Then, as shown in FIG. 10A, wiring electrodes 4 for connection provided on the upper surface of the wiring substrate 3 are aligned with the protruded electrodes 2 on the principal surface of the semiconductor chip 1 of the semiconductor device.

Then, as shown in FIG. 10B, the wiring electrodes 4 on the wiring substrate 3 are connected to the protruded electrodes 2 on the semiconductor device. In this case, when the protruded electrodes 2 are solder balls, the solder balls are joined to the wiring electrodes 4 on the wiring substrate 3 while the solder balls are melted.

Thereafter, as shown in FIG. 10C, the gap between the semiconductor chip 1 of the semiconductor device and the wiring substrate 3 is filled and sealed with an underfill material 5 such as an insulating resin while the protruded electrodes 2 of the semiconductor device are connected to the wiring substrate 3. Then, the underfill material 5 is cured to finish the substrate mounting.

FIGS. 11A to 11C show another mounting method. In this mounting method, an under filling material is first supplied onto a surface of a wiring substrate, and the semiconductor device is pressed onto the substrate in such a manner that the under filling material is sandwiched for connection. Hereinafter, this approach will be described more specifically.

First, as shown in FIG. 11A, the underfill material 5 as an insulative resin sheet having a desired thickness and area is attached onto the wiring electrodes 4 of the wiring substrate 3 such as a printed substrate to be incorporated into electronic equipment.

Then, as shown in FIG. 11B, the wiring electrodes 4 of the wiring substrate 3 are aligned with the protruded electrodes 2 of the semiconductor, and then the semiconductor device is pressed with its face down under heat and pressure in such a manner that the underfill material 5 as an insulating resin sheet supplied onto the surface of the wiring substrate 3 is sandwiched therebetween, so that the protruded electrodes 2 penetrate the underfill material 5. Thus, the protruded electrodes 2 of the semiconductor chip 1 are connected to the wiring electrodes 4.

Thereafter, as shown in FIG. 11C, the sheet-like underfill material 5 is cured to finish the substrate mounting.

As described above, in the conventional devices, the wiring electrodes on the wiring substrate are connected to the semiconductor device in the form of a chip used for bare chip mounting via the protruded electrodes, and the underfill material is formed in the gap therebetween to mount the semiconductor device, and thus the underfill material is formed by being supplied after or before the connection of the semiconductor device and the wiring electrodes.

The conventional semiconductor device has a structure where the protruded electrodes are provided on electrode pads disposed in the peripheral portion of a semiconductor chip, and the electrode pads are formed in the peripheral region outside the semiconductor integrated circuit element on the semiconductor chip. Therefore, the two-dimensional area arrangement of the electrode pads inside the chip surface cannot be achieved, so that there is a limit for higher density as a semiconductor device.

For this reason, recently, a semiconductor device has been under development in which electrode pads on the semiconductor chip are wired around (rewired), and contact pads connected to the electrode pads in a two-dimensional area are formed on the principal surface (on the semiconductor integrated circuit element) of the semiconductor chip. However, there are various limitations in order to connect such a semiconductor device (that is, a semiconductor device in which contact pads connected to electrode pads are formed on the semiconductor integrated circuit element region) and a wiring substrate.

For example, when performing substrate mounting by supplying a sheet-like or film-like underfill material onto a wiring substrate, and pressing protruded electrodes formed on the contact pads of the semiconductor device with the underfill material sandwiched therebetween, a pressure is applied to the semiconductor device. Consequently, this pressure causes damage to the semiconductor integrated circuit element below the contact pads of the semiconductor device, which imposes some limitations on how to mount it on a substrate. Furthermore, when connecting the wiring electrodes on the wiring substrate to the contact pads, and then filling and sealing the gap between them with an underfill material, voids may be generated in the underfill material.

Furthermore, in the conventional method for mounting a semiconductor device, it is necessary to fill or attach an underfill material to a wiring substrate for each semiconductor device to achieve substrate mounting, which causes a problem in terms of the mounting efficiency of substrate mounting. In addition, there is also an increase in the mounting cost due to the introduction of a new mounting facility with high precision for use in substrate mounting.

SUMMARY OF THE INVENTION

Therefore, with the foregoing in mind, it is a main object of the present invention to provide a semiconductor device and a mounting method that can improve the mounting efficiency of substrate mounting. It is another object of the present invention to provide a semiconductor device that can realize highly reliable substrate mounting and a method for producing the same, and a method for mounting a semiconductor device.

A semiconductor device of the present invention includes a semiconductor chip having a principal surface provided with a plurality of electrode pads; an insulating layer formed on a region excluding the plurality of electrode pads on the principal surface of the semiconductor chip; a plurality of contact pads arranged on the insulating layer on the principal surface of the semiconductor chip; a wiring layer electrically connected to at least one of the plurality of electrode pads and electrically connected to at least one of the plurality of contact pads, thereby establishing rewiring connection; an insulative resin layer formed on a region excluding the plurality of contact pads on the principal surface of the semiconductor chip; a protruded electrode provided on each of the plurality of contact pads; and an underfill material layer provided on the insulative resin layer in such a manner that the top of the protruded electrode is exposed.

Another semiconductor device of the present invention includes a semiconductor chip having a principal surface provided with a plurality of electrode pads; an elastic layer formed on a region excluding the plurality of electrode pads on the principal surface of the semiconductor chip; a plurality of contact pads arranged two-dimensionally on the elastic layer on the principal surface of the semiconductor chip; a wiring layer electrically connected to at least one of the plurality of electrode pads and electrically connected to at least one of the plurality of contact pads, thereby establishing rewiring connection; an insulative resin layer formed on a region excluding the plurality of contact pads on the principal surface of the semiconductor chip; a protruded electrode provided on each of the plurality of contact pads; and an underfill material layer provided on the insulative resin layer in such a manner that the top of the protruded electrode is exposed.

In one embodiment of the present invention, the upper surface of the underfill material layer is substantially flush with the top of the protruded electrode.

In one embodiment of the present invention, the top of the protruded electrode is projected and exposed from the upper surface of the underfill material layer by 1 μm to 200 μm.

In one embodiment of the present invention, the protruded electrode is a solder ball.

It is preferable that the protruded electrode is a solder ball, and the underfill material layer is made of a thermoplastic resin.

It is preferable that the Young's modulus of the elastic layer is 10 to 2000 kg/mm$^2$.

In one embodiment of the present invention, the underfill material layer is an epoxy resin layer.

It is preferable that the end of the elastic layer has an oblique side in its cross section.

A method for producing a semiconductor of the present invention includes preparing a semiconductor chip having a principal surface provided with a plurality of electrode pads; forming an elastic layer made of a low elastic material on a region excluding the plurality of electrode pads on the principal surface of the semiconductor chip; forming a wiring layer having one end electrically connected to at least one of the plurality of electrode pads, and having the other end extended onto the elastic layer to arrange contact pads two-dimensionally; forming an insulative resin layer for coating at least the wiring layer and the electrode pads, except the plurality of contact pads, on the principal surface of the semiconductor chip; forming a protruded electrode made of a conductive material provided on the contact pad; and forming an underfill material layer on the principal surface of the semiconductor chip in such a manner that the top of the protruded electrode is exposed.

It is preferable that the step of preparing a semiconductor chip is the step of preparing a semiconductor water in which a plurality of semiconductor chips are formed on its surface.

A mounting method of the present invention is for mounting a semiconductor device on a substrate with electrical connection between the semiconductor device and the wiring substrate having wiring electrodes. The semiconductor device includes a semiconductor chip having a principal surface provided with a plurality of electrode pads; an elastic layer formed on a region excluding the plurality of electrode pads on the principal surface of the semiconductor chip; a plurality of contact pads arranged two-dimensionally on the elastic layer on the principal surface of the semiconductor chip; a wiring layer electrically connected to at least one of the plurality of electrode pads and electrically connected to at least one of the plurality of contact pads, thereby establishing rewiring connection; an insulative resin layer formed on a region excluding the plurality of contact pads on the principal surface of the semiconductor chip; a protruded electrode provided on each of the plurality of contact pad; and an underfill material layer provided on the insulative resin layer in such a manner that the top of the protruded electrode is exposed. The method includes opposing the principal surface of the semiconductor device to the principal surface of the wiring substrate to align the protruded electrode of the semiconductor device with the wiring electrode on the wiring substrate; bringing the protruded electrode of the semiconductor device into contact with the wiring electrode on the wiring substrate; and softening and melting the underfill material layer of the semiconductor device by heating to fill and seal the gap between the principal surface of the semiconductor device and the principal surface of the wiring substrate with the underfill material layer.

In one embodiment of the present invention, the step of bringing the protruded electrode of the semiconductor device into contact with the wiring electrode on the wiring substrate is performed by pressing the top of the protruded electrode exposed from the underfill material layer into the wiring electrode on the wiring substrate by applying a pressure for contact with each other.

In one embodiment of the present invention, the top of the protruded electrode included in the semiconductor device is projected and exposed from the upper surface of the underfill material layer, the protruded electrode is a solder ball, and the underfill material layer is made of a thermoplastic resin, and the method further includes applying a solder paste having a melting point lower than the melting point of the solder ball onto the wiring electrode on the wiring substrate; and melting the applied solder paste at a temperature lower than the melting point of the solder ball after the protruded electrode is in contact with the wiring electrode.

According to the present invention, the underfill material layer is formed on an insulative resin layer in such a manner that the tops of the protruded electrodes are exposed, so that the mounting efficiency of substrate mounting can be improved. Moreover, highly efficient and highly reliable substrate mounting can be realized by bringing the semiconductor device having the underfill material layer into contact with the wiring electrodes on the wiring substrate and heating the underfill material.

The method for producing a semiconductor device of the present invention allows the elastic layers, the wiring layers and the underfill material layers in a large number of semiconductor chip regions to be formed in a semiconductor wafer that has not been divided into semiconductor chips. Therefore, it is possible to reduce the production cost significantly by preparing semiconductor chips for use in production in the form of a semiconductor wafer.

In addition, in the structure in which the protruded electrodes included in the semiconductor device are formed with solder balls, and the tops thereof are projected and exposed from the upper surface of the underfill material layer made of a thermoplastic resin, the self-aligning function can be exerted effectively, if a solder paste having a melting point lower than the melting point of the solder balls is provided on the wiring electrodes on the wiring substrate, and then the protruded electrodes and the wiring electrodes are brought into contact, and then, the solder paste is melted at a temperature lower than the melting point of the solder balls.

DETAILED DESCRIPTION OF THE INVENTION

Figure 1A:
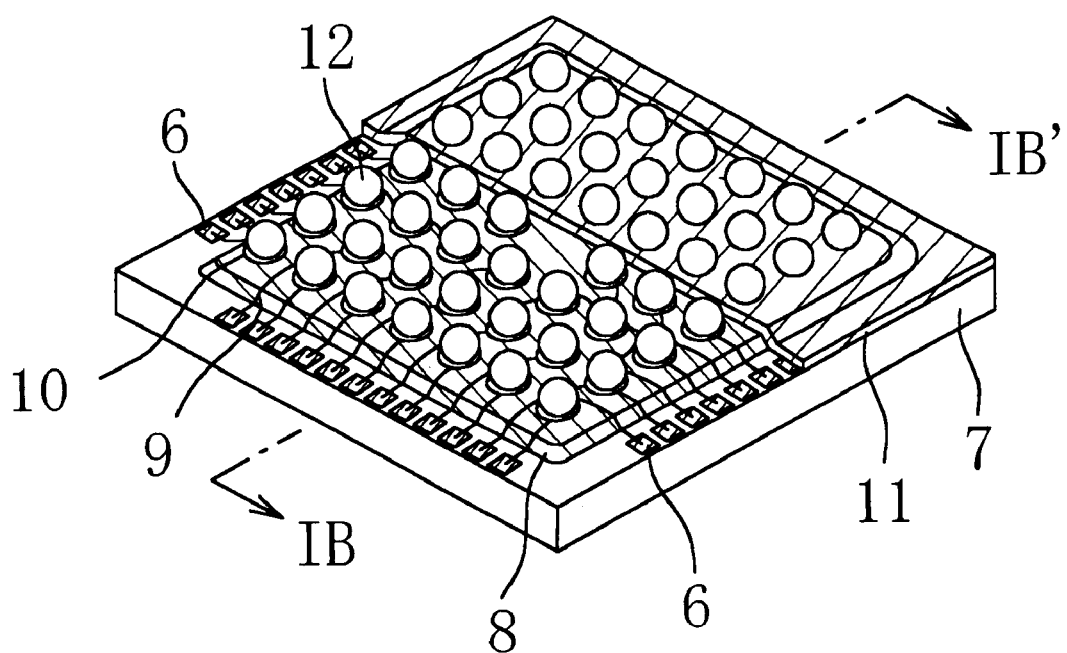
FIG. 1A is a perspective view schematically showing the structure on which the semiconductor device of an embodiment of the present invention is based.

Hereinafter, embodiments of the present invention will be described with reference to the accompanying drawings. For simplification of description, in the following drawings, components having substantially the same function bear the same reference numerals. The present invention is not limited to the following embodiments.

First, referring to FIGS. 1A, 1B, 2A and 2B, a semiconductor device of an embodiment of the present invention will be described.

Figure 1B:
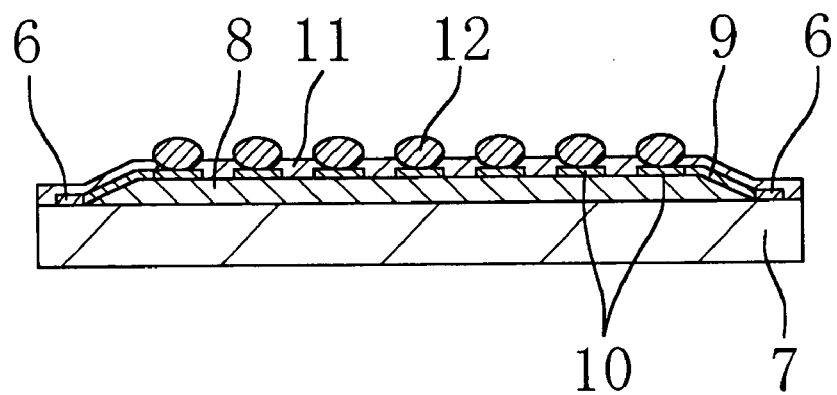
FIG. 1B is a cross-sectional view taken along line IB–IB' of FIG. 1A.

FIGS. 1A and 1B schematically shows the structure of an electrode rewiring type semiconductor device in the form of a chip, which is the basis of the structure of the semiconductor device of this embodiment. FIG. 1A is a perspective view, which is partially cut away for better illustration of the structure. In addition, in FIG. 1A, for visual convenience, some components are hatched. FIG. 1B is a cross-sectional view taken along line IB–IB' of FIG. 1A.

As shown in FIGS. 1A and 1B, the structure on which the semiconductor device of this embodiment is based includes a semiconductor chip 7 having a principal surface provided with a plurality of electrode pads 6, and an elastic layer 8 formed on a region excluding the electrode pads 6 of the principal surface of the semiconductor chip 7. A plurality of pads 10 are arranged two-dimensionally on the elastic layer 8 on the principal surface of the semiconductor chip 7, and at least one of the plurality of electrode pads 6 and at least one of the plurality of contact pads 10 are connected to each other by rewiring with a wiring layer 9. In this embodiment, one contact pad 10 is connected to one electrode pad 6 via one wiring layer 9. The contact pad 10 is formed integrally with the wiring layer 9. An insulative resin layer 11 is formed on the region excluding the contact pads 10 on the principal surface of the semiconductor chip 7, and a protruded electrode (solder ball) 12 is provided on each contact pad 10.

The structure shown in FIGS. 1A and 1B will be described more specifically below. The structure shown in FIGS. 1A and 1B includes a semiconductor chip 7 having a plurality of electrode pads 6 connected to an internal semiconductor integrated circuit element in the peripheral region on one principal surface, and an elastic layer 8 made of a low elastic resin that is formed on a region excluding the electrode pads 6 on the principal surface of the semiconductor chip 7. A plurality of contact pads 10 are arranged two-dimensionally on the elastic layer 8 formed on the principal surface of the semiconductor chip 7, by rewiring connection with the wiring layer 9 made of a metal conductor connected to the electrode pads 6. An insulative resin layer 11 such as a solder resist for protecting the electrode pads 6 and the wiring layer 9 is formed on a region excluding the contact pads 10 on the principal surface of the semiconductor chip 7, and a protruded electrode 12 such as a solder ball is formed on each contact pad 10. The protruded electrode (solder ball) 12 may not be necessarily formed on all the contact pads 10, and the number and the pitch of the protruded electrodes 12 can be set in accordance with the wiring electrodes of the wiring substrate.

Figure 2A:
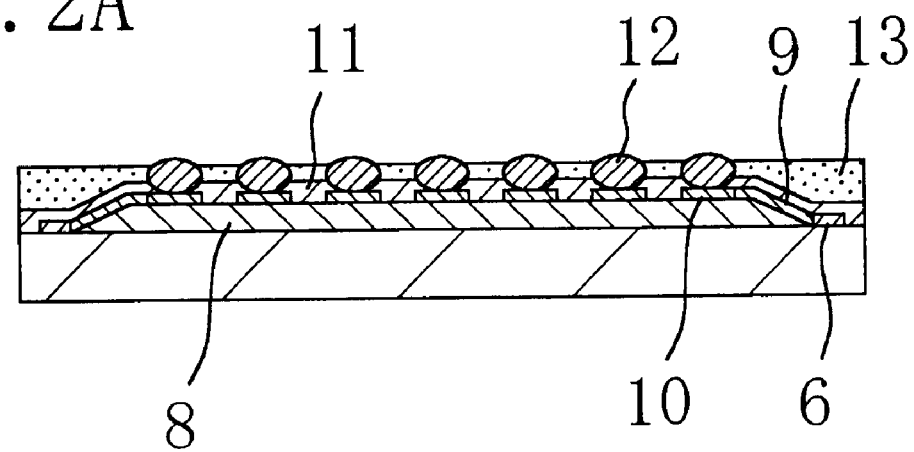
FIG. 2A is a perspective view schematically showing the structure of the semiconductor device of an embodiment of the present invention.
Figure 9:
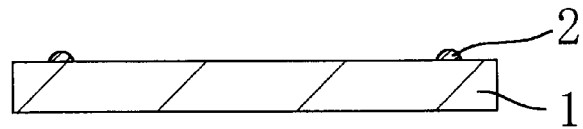
FIG. 9 is a cross-sectional view schematically showing the structure of a conventional semiconductor device.
Figure 10A:
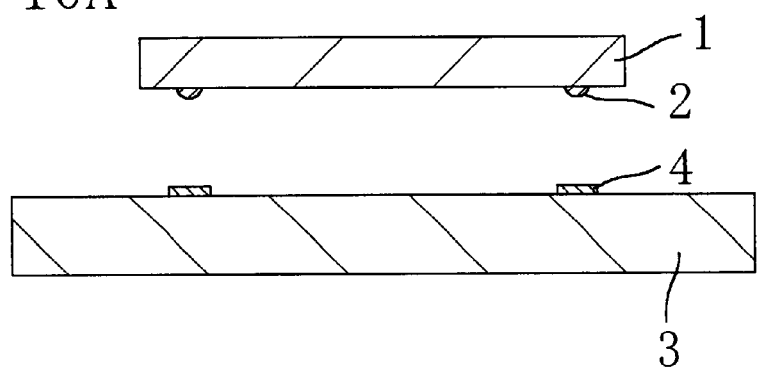
FIGS. 10A to 10C are sequential cross-sectional views for illustrating a method for mounting the conventional semiconductor device.
Figure 10B:
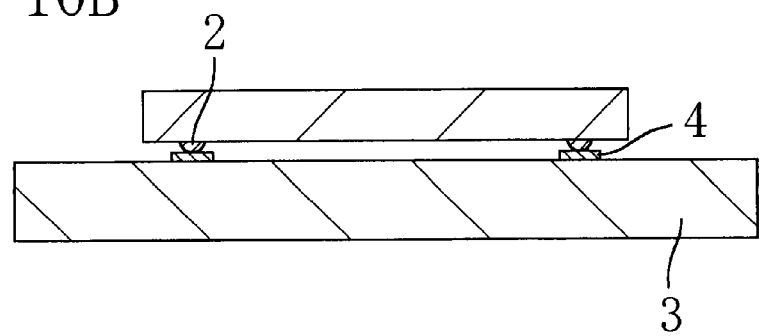
Figure 10C:
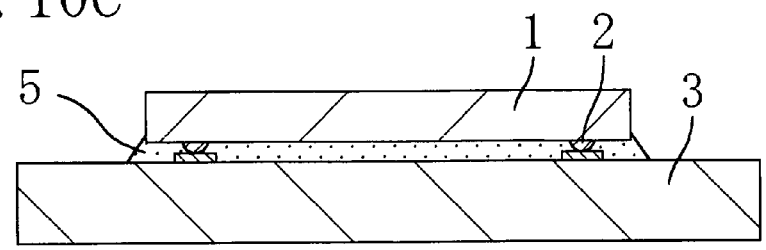
Figure 11A:
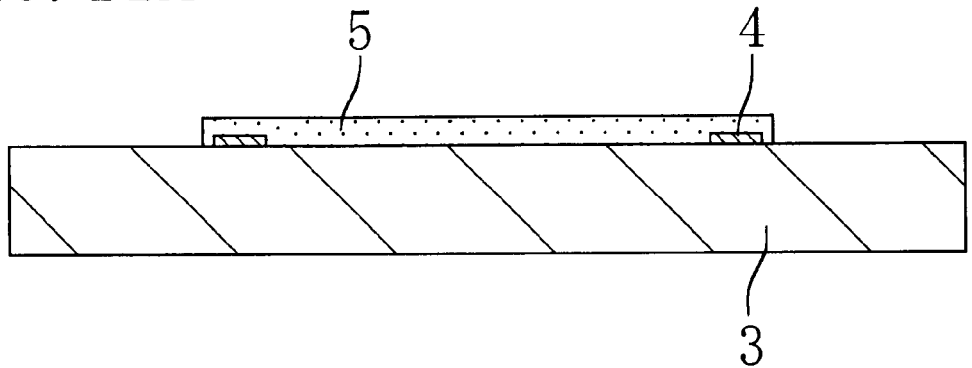
FIGS. 11A to 11C are sequential cross-sectional views for illustrating another method for mounting the conventional semiconductor device.
Figure 11B:
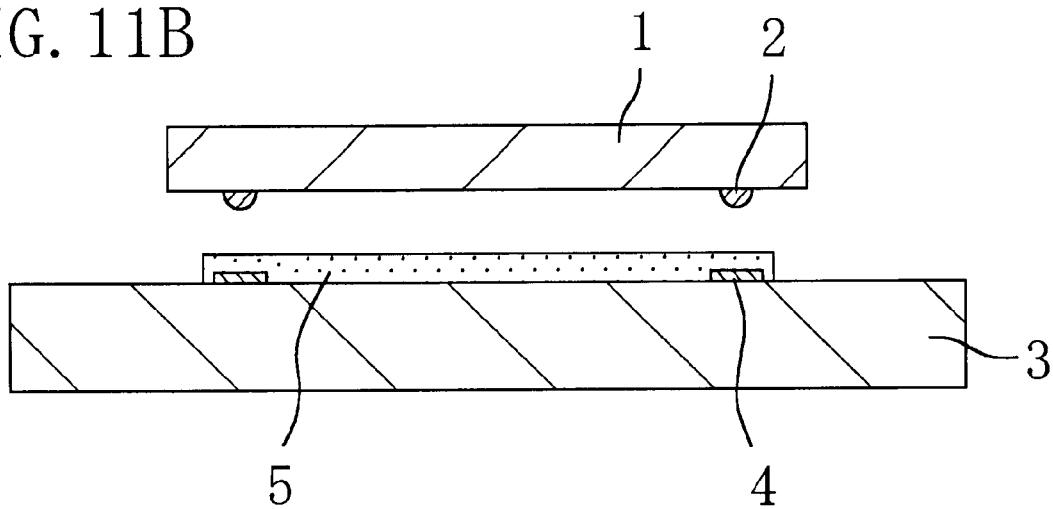
Figure 11C:
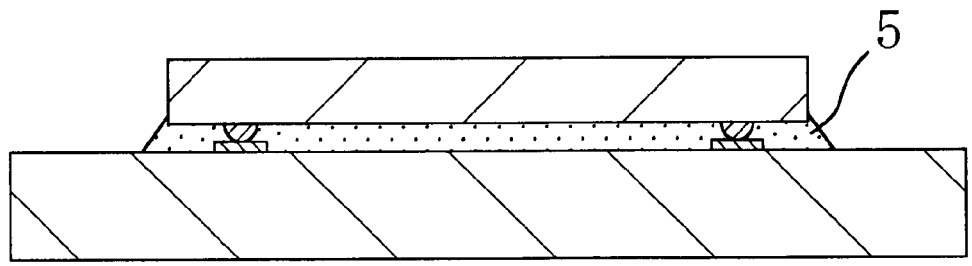

As shown in FIG. 2A, the semiconductor device of this embodiment has an underfill material layer 13, in addition to the components shown in FIGS. 1A and 1B. The underfill material layer 13 is formed on the insulative resin layer 11 in such a manner that the top of the protruded electrode 12 is exposed. Unlike the conventional structure shown in FIG. 9, the semiconductor device of this embodiment has the structure in which the top of the protruded electrode 12 on the contact pad 10 is exposed and the underfill material layer 13 is provided on the insulative resin layer 11. The underfill material layer 13 is formed of, for example, an epoxy resin. However, not only epoxy resin but also any insulative material that achieves airtightness when the semiconductor device is mounted on a substrate can be used for the underfill material layer 13.

Figure 2B:
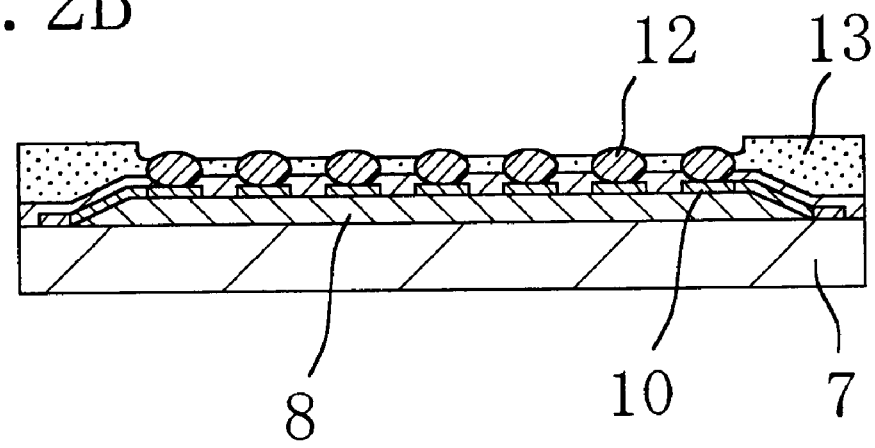
FIG. 2B is a cross-sectional view schematically showing the structure of a variation of the semiconductor device of an embodiment of the present invention.

In FIG. 2A, the upper surface of the underfill material layer 13 is substantially flush with the top of the protruded electrode 12, but the top of the protruded electrode 12 can be projected from the upper surface of the underfill material layer 13 by 1 µm to 200 µm, preferably about 50 µm, depending on the manner in which the semiconductor device is mounted on a substrate. As shown in FIG. 2B, the underfill material layer 13 located in the peripheral portion of the semiconductor chip 7 may be made thicker. More specifically, the upper surface of the underfill material layer 13 that is located in an outer portion than the outermost contact pads of the contact pads 10 may be higher than the top of the protruded electrode 12. When the thickness is adjusted such that the upper surface of the underfill material layer 13 is located above the top of the protruded electrode 12, the gap between the wiring substrate and the semiconductor device can be sealed when it is mounted on the substrate, and in addition, a fillet portion can be formed with the underfill material, so that the mounting reliability can be improved.

In the structures shown in FIGS. 2A and 2B, solder balls are used as the protruded electrodes 12, but not only solder balls but also protruded electrodes in the form of bumps made of metal material can be used.

The modulus of elasticity (Young's modulus) of the elastic layer 8 is preferably in the range from 10 to 2000 kg/mm$^2$, more preferably in the range from 10 to 1000 kg/mm$^2$. The coefficient of linear expansion of the elastic layer 8 is preferably in the range of 5 to 200 ppm/° C., and more preferably in the range of 10 to 100 ppm/° C. The elastic layer 8 can be made of polymer such as polyimide with ester bonds and acrylate based epoxy, or any suitable material that has a low modulus of elasticity and is insulative can be used. The thickness of the elastic layer 8 is, for example, 1 to 100 µm, preferably 30 µm.

It is preferable that the ends of the elastic layer 8 have an oblique portion in its cross-section, as shown in FIGS. 1A, 1B, 2A, and 2B. With this structure, the precision in forming the wiring layer 9 by wiring around the electrode pads 6 can be improved, and the wire can be prevented from being broken. As a result, the reliability can be enhanced. In this embodiment, the elastic layer 8 can be formed of a resin having elasticity, but can be formed of an insulative layer such as polyimide having a thickness, of for example, 5 µm or more, depending on the manner in which the semiconductor device is mounted on a substrate.

Next, a method for producing a semiconductor device of this embodiment will be described with reference to FIGS. 3A to 4B.

FIGS. 3A to 4B are sequential cross-sectional views showing the principal processes for illustrating a method for producing a semiconductor device of this embodiment.

Figure 3A:
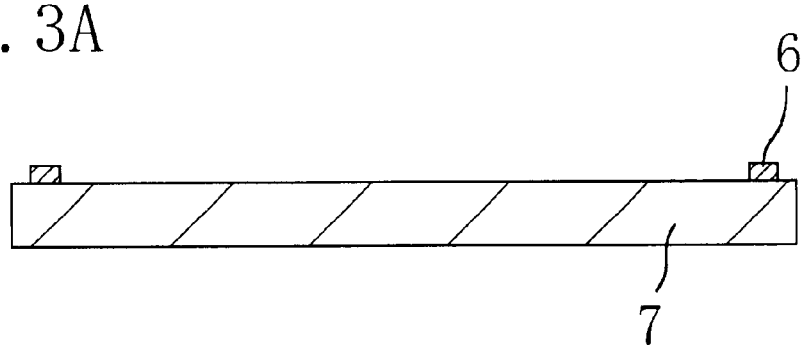
FIGS. 3A to 3D are sequential cross-sectional views for illustrating a method for producing a semiconductor device of an embodiment of the present invention.

First, as shown in FIG. 3A, a semiconductor chip 7 in which a plurality of electrode pads 6 are formed in the peripheral portion on one principal surface, and a semiconductor integrated circuit element is formed is prepared. Alternatively, instead of a chip unit, a semiconductor wafer in which a plurality of semiconductor chips are formed in its surface is prepared and production is performed by wafer level. In this case, mass production is possible, which is a large advantage in the production process.

Figure 3B:
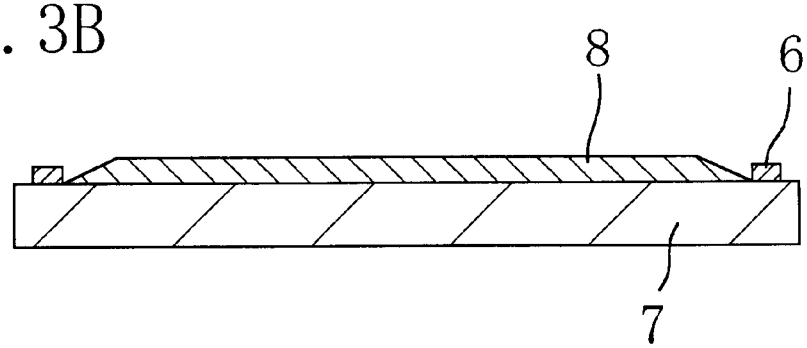

Next, as shown in FIG. 3B, an elastic layer 8 is formed by depositing a low elastic material so as to cover the principal surface region excluding the plurality of electrode pads 6 on the principal surface of the prepared semiconductor chip 7 or each semiconductor chip in the semiconductor wafer.

More specifically, first, a photosensitive and insulative material having a low modulus of elasticity is applied in a thickness of about 100 µm onto the electrode pads 6 and a passivation film (not shown) formed on the principal surface of the semiconductor chip 7 and dried, so that an elastic layer film is formed. Then, the light exposure and development are sequentially performed with respect to the dried elastic layer film, so that the elastic layer 8 in which the portions corresponding to the electrode pads 6 on the semiconductor chip 7 are opened is formed. In this case, for example, not collimated light but scattered light is used for exposure so that the cross-sectional shape of the elastic layer 8 in the opening portion is not perpendicular to the principal surface of the semiconductor chip 7 but oblique, and does not have an acute angle. That is to say, the upper surface (the principal surface) and the oblique surface of the elastic layer 8 form an obtuse angle (e.g., about 100 to 140 degrees). In this embodiment, the end of the opening of the elastic layer 8 is inclined to as to be coupled to the surface of the semiconductor chip 7 smoothly, which makes it easy to form a wiring layer 9, and to produce a structure in which the wire is hardly broken.

In view of reducing the thermal stress when a semiconductor device is mounted on a substrate, the thicker elastic layer 8 is better, unless the thickness is not detrimental to the processes after the application. For example, the thickness can be about 500 µm or about 1 mm. As the low elastic photosensitive material, for example, polymer such as polyimide with ester bonds and acrylate based epoxy or any material that has a low modulus of elasticity and is insulative can be used. It is not necessary to form the low elastic photosensitive material by drying a liquid material, but material that is previously formed in the form of a film may be used. In this case, the film-like low elastic material is attached onto the semiconductor chip 7, exposed to light and developed so that openings can be formed in the low elastic material to expose the electrode pads 6 on the semiconductor chip 7. Furthermore, the low elastic insulative material constituting the elastic layer 8 is not necessarily photosensitive. When using a material that is not photosensitive, the electrode pads 6 on the semiconductor chip 7 can be exposed by mechanical processing with laser or plasma or chemical processing such as etching.

Figure 3C:
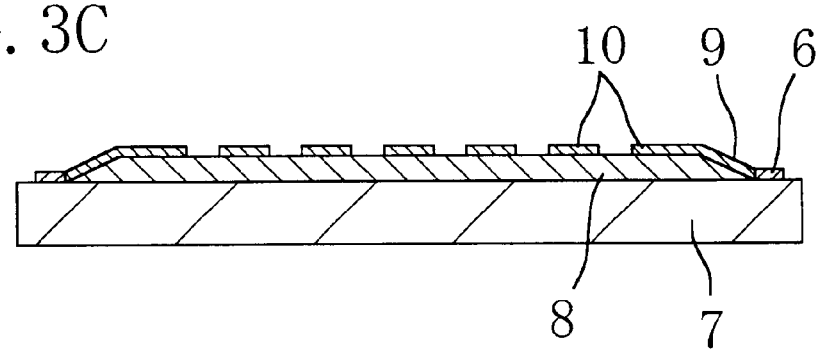

Next, as shown in FIG. 3C, a wiring layer 9 is formed such that one end thereof is connected to the electrode pads 6 and the other end is extended onto the elastic layer 8 on the principal surface of the semiconductor chip 7 so as to constitute contact pads 10 in a two-dimensional arrangement.

More specifically, for example, a thin metal layer including a titanium (Ti) film having a thickness of about 0.2 µm and a copper (Cu) film having a thickness of about 0.5 µm formed thereon is formed on the principal surface of the semiconductor chip 7 by vacuum deposition, sputtering, CVD or electroless plating. Then, a plated resist film is formed by applying a negative photoresist onto the thin film metal layer, curing the portion other than the desired pattern for a finished product, and removing the reacted portion. Herein, a negative photoresist is used to form the plated resist film, but a positive photoresist can be used. Then, for example, a thick metal layer having a thickness, for example, about 20 µm, made of a Cu film is formed by electrolytic plating selectively on the portion of the thin metal layer except the portion in which the plated resist film is formed.

After the thick metal layer is formed, the plated resist film is melted and removed. Then, the entire surface is subjected to etching with etchants that can melt the thin metal layer and the thick metal layer, for example, a cupric chloride solution for the Cu film and an EDTA solution for the Ti film. Then, the thin metal layer that is thinner than the thick metal layer is removed earlier. Thus, a predetermined metal wiring pattern including the electrode pads 6 and the wiring layer 9, and the contact pads 10 can be formed on the principal surface of the semiconductor chip 7.

Cu is used to form the thin metal layer or the thick metal layer, but Cr, W, Ti/Cu, Ni or the like can be used instead of Cu. The thin metal layer and the thick metal layer are formed of different materials and in the final etching process, an etchant that selectively etches only the thin metal layer can be used.

Figure 3D:
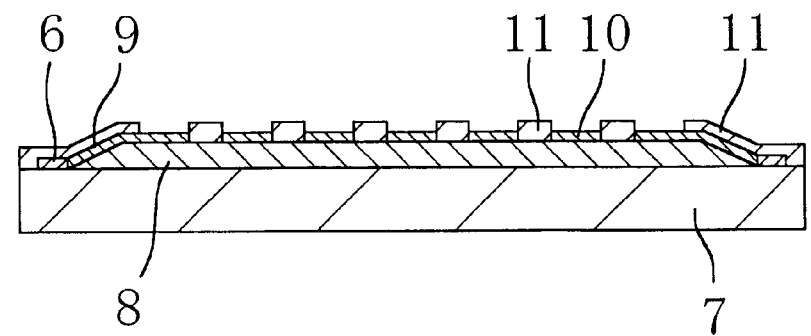

Then, as shown in FIG. 3D, an insulative resin layer 11 is formed by coating at least the wiring layers 9 and the electrode pads 6, except the contact pads 10, with an insulative resin on the principal surface of the semiconductor chip 7.

More specifically, photosensitive solder resist (insulative resin) is applied onto the elastic layer 8, and then a solder resist film (insulative resin layer 11) is formed so that only the portions of the contact pads 10 are exposed by using photolithography. This solder resist film can protect the electrode pads 6 and the wiring layers 9, which are portions other than the contact pads 10, from melted solder during mounting.

Figure 4A:
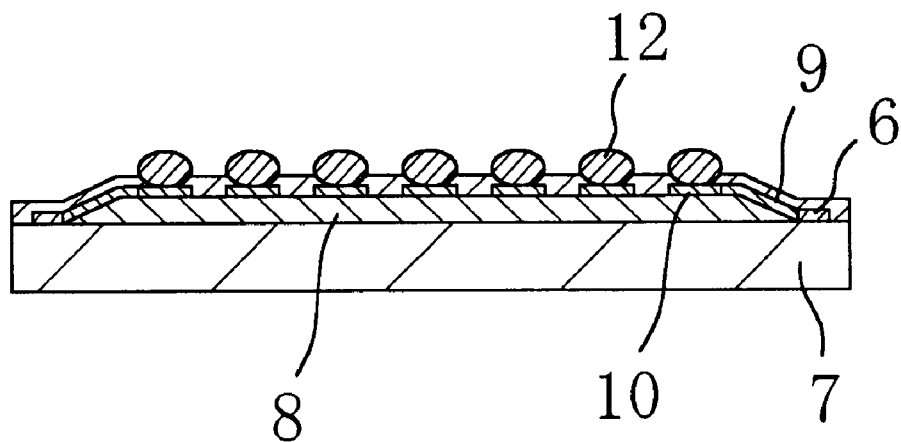
FIGS. 4A and 4B are sequential cross-sectional views for illustrating a method for producing a semiconductor device of an embodiment of the present invention.

Then, as shown in FIG. 4A, protruded electrodes 12 are formed of conductive material on the contact pads 10 on the semiconductor chip 7. More specifically, the protruded electrodes 12 are formed by placing metal balls made of solder, copper plated with solder, nickel or the like on the contact pads 10 and melting and joining the metal balls and the contact pads 10.

Figure 4B:
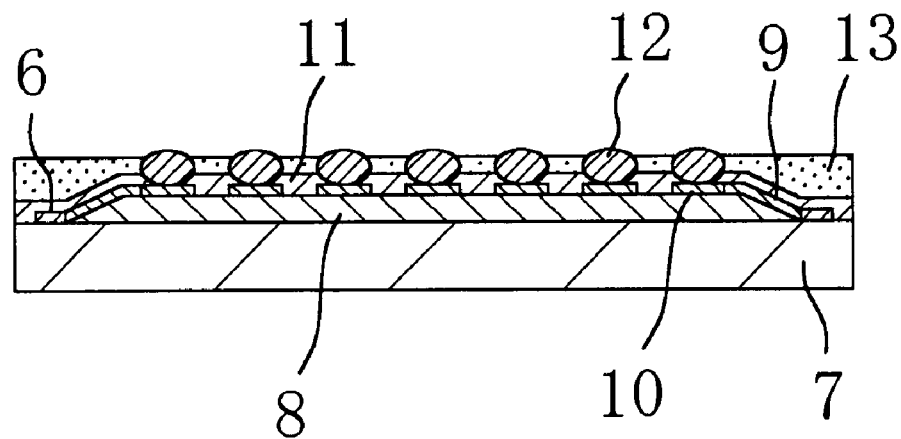

Thereafter, as shown in FIG. 4B, an underfill material layer 13 is formed such that the top of the protruded electrode 12 on the contact pad 10 is exposed on the principal surface of the semiconductor chip 7. In this embodiment, an underfill material layer 13 is formed in such a manner that the upper surface of the underfill material layer 13 is substantially flush with the top of the protruded electrode 12, but as described above, the top of the protruded electrode 12 can be projected from the upper surface of the underfill material layer 13 by 1 µm to 200 µm, preferably about 50 µm. When the top of the protruded electrode 12 is projected from the upper surface of the underfill material layer 13, the protruded electrodes can be pressed into the wiring electrodes on the wiring substrate by applying a pressure during substrate mounting, and the underfill material layer 13 can be attached tightly onto the wiring substrate side, so that the gap between them can be sealed satisfactorily.

Furthermore, as shown in FIG. 2B, the underfill material layer 13 can be formed such that the underfill material layer 13 located in the peripheral portion of the semiconductor chip 7 is higher. Describing this in greater detail, the upper surface of the underfill material layer 13 can be formed by adjusting the thickness such that the upper surface of the underfill material layer 13 that is located in an outer portion than the outermost contact pads of the contact pads 10 is located above the top of the protruded electrode 12. With this, the gap between the wiring substrate and the semiconductor device can be sealed when it is mounted on the substrate, and in addition, a fillet portion can be formed with the underfill material, so that the mounting reliability can be improved.

More specifically, the underfill material is applied onto the insulative resin layer 11 on the semiconductor chip 7, and then the underfill material layer 13 is formed such that the top of the contact pad 10 is exposed by photolithography or etching, Herein, an epoxy resin is used as the material for the underfill material layer.

The above-described processes can achieve a semiconductor device with high density in the form of a chip suitable for mounting on a substrate.

As described above, in this embodiment, the production process with a semiconductor chip has been described. However, in the process of preparing the semiconductor chip on which the electrode pads are formed on its principal surface, a semiconductor wafer on which a plurality of semiconductor chips are formed is prepared, and thus semiconductor chips can be produced by semiconductor wafer unit. Thus, the elastic layers or the wiring layers can be formed in a large number of semiconductor chip regions in a semiconductor wafer that has not been divided into semiconductor chips, so that the production cost can be reduced significantly.

Figure 5A:
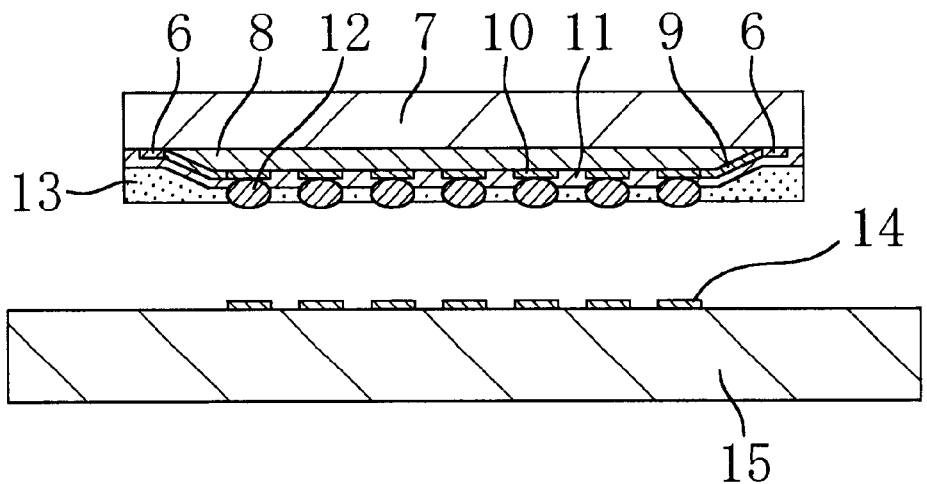
FIGS. 5A to 5C are sequential cross-sectional views for illustrating a method for mounting a semiconductor device of an embodiment of the present invention.
Figure 5B:
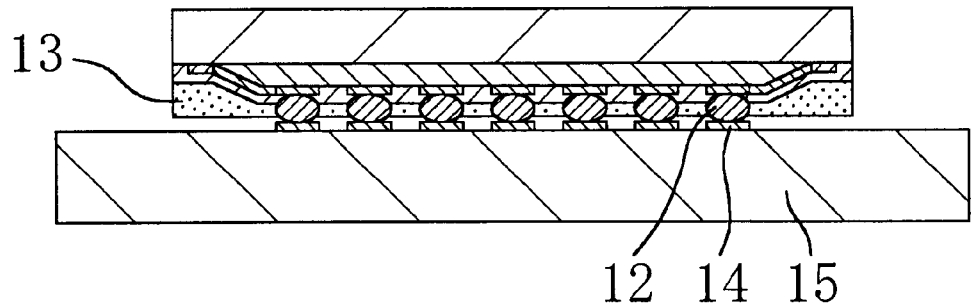
Figure 5C:
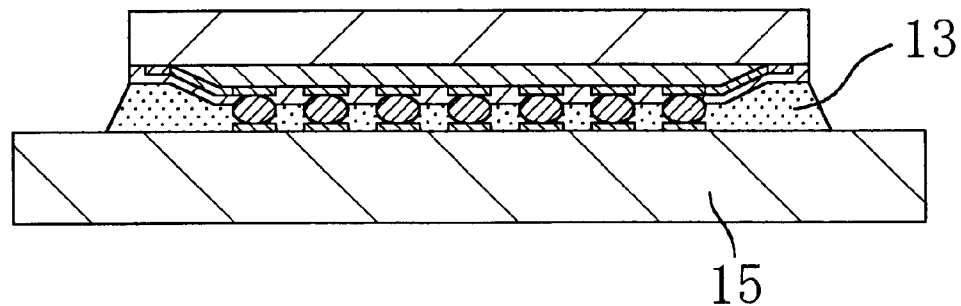

Next, a method for mounting a semiconductor device of this embodiment will be described with reference to FIGS. 5A to 5C. FIGS. 5A to 5C are sequential cross-sectional views showing the principal processes for illustrating a method for mounting a semiconductor device of this embodiment.

First, as shown in FIG. 5A, the principal surface of the semiconductor device of this embodiment shown in FIG. 2A is opposed to the wiring electrode side of a wiring substrate having wiring electrodes 14 and the electrodes on the two sides are aligned with each other. The semiconductor device of this embodiment includes an underfill material layer 13, as described above. More specifically, the semiconductor device of this embodiment includes a semiconductor chip 7 having a plurality of electrode pads 6 on its principal surface, an elastic layer 8 formed on a region excluding the electrode pads 6 on the principal surface of the semiconductor chip 7, a plurality of contact pads 10 two-dimensionally arranged by rewiring arrangement with the wiring layer 9 connected to each of the electrode pads 6 on the elastic layer 8 on the principal surface of the semiconductor chip 7, an insulative resin layer 11 formed on the principal surface of the semiconductor chip 7 excluding the plurality of contact pads 10, a protruded electrode 12 formed on each of the contact pads 10, and the underfill material layer 13 provided on the insulative resin layer 11 with the top of the protruded electrode exposed.

Then, as shown in FIG. 5B, the protruded electrodes 12 of the semiconductor device are brought into contact with the wiring electrodes 14 of the wiring substrate 15. In this bringing them into contact, if the tops of the protruded electrodes exposed from the underfill material layer 13 are pressed into the wiring electrodes 14 of the wiring substrate by applying a pressure, more reliable connection can be obtained.

Thereafter, as shown in FIG. 5C, the underfill material layer 13 of the semiconductor device is softened and melted by heating so that the gap between the principal surface of the semiconductor device and the principal surface of the wiring substrate 15 is sealed with the underfill material layer 13 to finish the substrate mounting. The underfill material layer 13 can be heated at 150° C. to be softened and melted to fill the gap without voids.

According to the method for mounting a semiconductor device of this embodiment, the electrodes can be electrically connected and sealed simply by bringing the semiconductor device having the underfill material layer 13 into contact with the wiring electrode 14 of the wiring substrate 15 and heating the underfill material layer 13, so that substrate mounting with high efficiency and reliability can be realized.

Thus, the semiconductor device of this embodiment has the underfill material layer 13, which is required when the device is mounted on a substrate, so that more efficient and reliable substrate mounting can be realized. Furthermore, since the protruded electrodes 12 such as solder balls are provided on the contact pads 10 connected to the wiring layer 9, the process for mounting the semiconductor device on the wiring substrate can be performed in a very simple and swift manner. In the semiconductor device of this embodiment, the elastic layer 8 is present between the protruded electrodes 12 to be connected and the semiconductor integrated circuit element region of the semiconductor chip 7, so that the element can be prevented from being damaged by the pressure applied during mounting. As a result, the device can be mounted efficiently.

Furthermore, the wiring layer 9 is provided on the underlying elastic layer 8. Therefore, even if a stress such as thermal stress is applied to the wiring layer 9 because of heating and cooling of the semiconductor device, for example, when mounting the semiconductor device on the wiring substrate such as a printed substrate, the stress applied to the wiring layer 9 can be reduced. Consequently, the wiring layer 9 can be prevented from being broken during substrate mounting, so that a wiring structure with high reliability can be realized. Furthermore, it is advantageous that the elastic layer 8 can absorb the thermal stress generated from the solder balls 12 having a large heat capacity.

In addition, the contact pads 10 that serve as external terminals are arranged two-dimensionally on the principal surface of the semiconductor device, so that a large number of external terminals can be provided in a small area, and the electrode pads 6 and the contact pads 10 can be connected by the wiring layer 9 that can be patterned. Therefore, a compact and thin semiconductor device that can be used in a structure with a large number of pins can be realized. Moreover, this structure is suitable for mircoprocessing so that it can be used in a structure with a large number of pins.

In the semiconductor device of this embodiment, when the height of the underfill material layer 13 is smaller than that of the ball electrode 12, there is another advantage in that the self-alignment properties of the semiconductor device with respect to the wiring substrate 15 can be improved. "Self-alignment" refers to the autonomic alignment of the wiring electrodes 14 on the wiring substrate 15 to the ball electrodes 12 of the semiconductor device without any external regulation. When the self-alignment properties are good, the connection reliability and the production yield can be improved, so that a reliable semiconductor device can be produced efficiently. Hereinafter, this will be described further with reference to FIGS. 6, 7A to 7D and 8.

Figure 6:
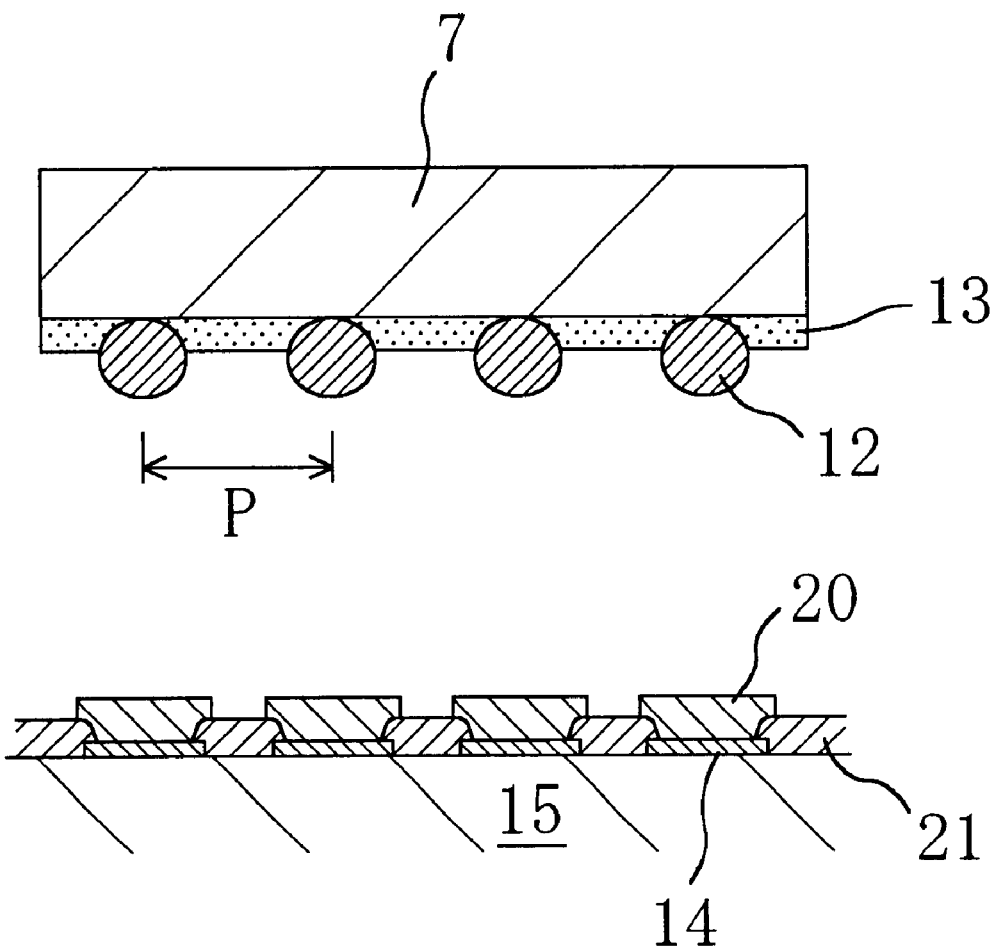
FIG. 6 is a cross-sectional view showing the structure of the semiconductor device of an embodiment of the present invention and a wiring substrate.

The semiconductor device of this embodiment having excellent self-alignment properties has a structure in which the height of the ball electrode 12 is larger than that of the underfill material layer 13, and the tops of the ball electrodes 12 made of solder balls are projected from the upper surface of the underfill material layer 13, as shown in FIG. 6. The underfill material layer 13 is formed of a thermoplastic resin. The components other than the semiconductor chip 7, the ball electrodes 12, and the underfill material layer 13 are omitted in FIG. 6.

Solder paste 20 having a melting point lower than the softening point of the thermoplastic resin constituting the underfill material layer 13 and the melting point of the ball electrodes 12 is applied onto the wiring electrode (land) 14 of the wiring substrate 15 on which the semiconductor device is to be mounted. It is preferable to form solder resist 21 in portions excluding the wiring electrode 14 of the wiring substrate 15, as shown in FIG. 6.

Describing the structure of the semiconductor device shown in FIG. 6 as an example, the diameter of the ball electrode 12 is 0.3 to 0.35 mm, and the pitch of the ball electrode 12 is 0.5 mm. The pitch of the wiring electrode 14 of the wiring substrate 15 is matched to the pitch of the ball electrodes 12. The number of the ball electrodes is 4 to 400, for example. The thickness of the underfill material layer 13 is 0.15 to 0.25 mm.

Figure 8:
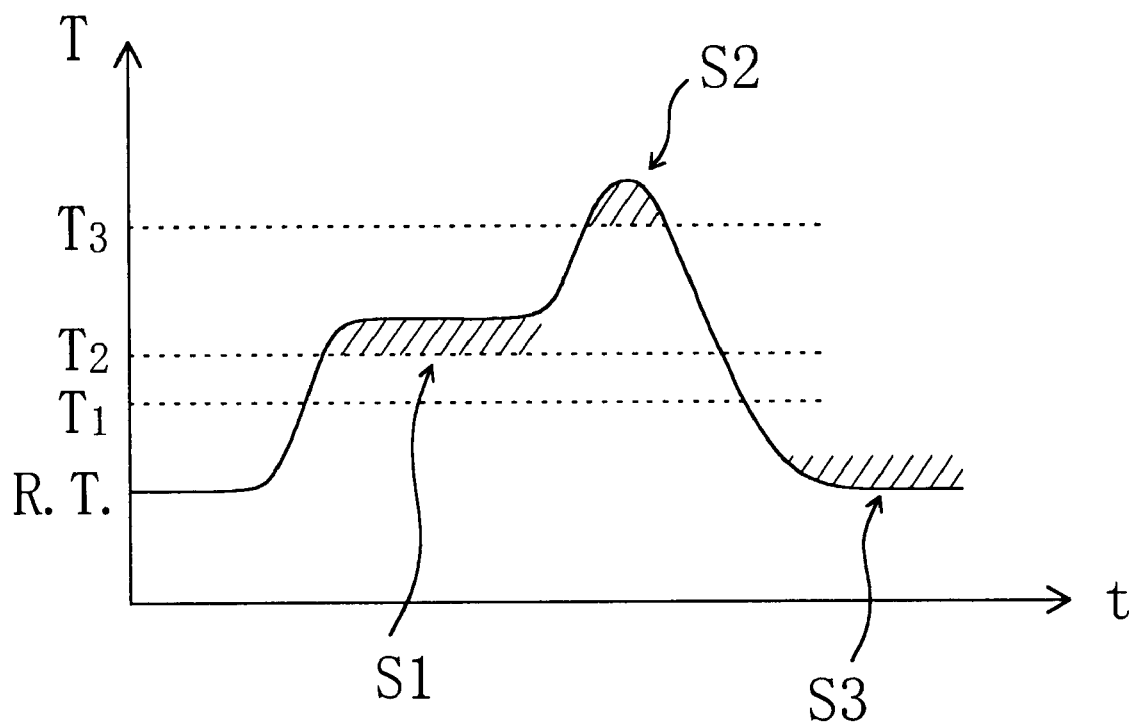
FIG. 8 is a graph showing a reflow profile of a reflow process.

As shown in FIG. 6, after the ball electrodes 12 of the semiconductor device are aligned with the wiring electrodes 14 on the wiring substrate 15, the ball electrodes 12 are brought into contact with the wiring electrodes 14. Then, a reflow process is performed. FIG. 8 shows the reflow profile in the reflow process. In FIG. 8, the temperature in the vertical axis is plotted against the time in the horizontal axis. R.T., $T_1$, $T_2$, and $T_3$ represent room temperature, the softening point of the resin of the underfill material layer 13, the melting point of the solder paste, and the melting point of the ball electrode, respectively. S1, S2, and S3 represent the self-aligning step, the ball electrode melting step, and the cooling step.

Figure 7A:
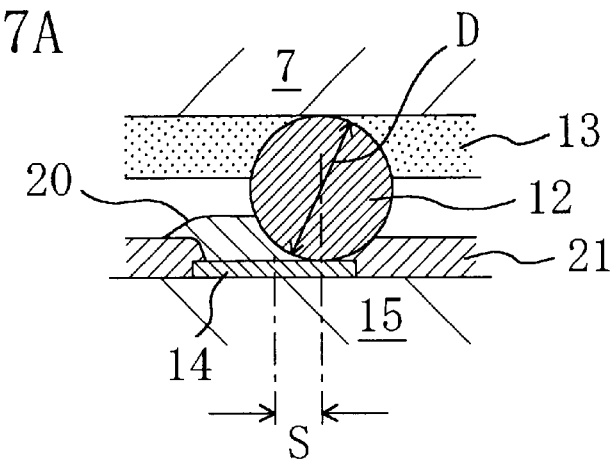
FIGS. 7A to 7D are sequential cross-sectional views for illustrating a self-alignment function.

It is assumed that when bringing the ball electrodes 12 into contact with the wiring electrodes 14, a mounting dislocation (S) is generated between the ball electrodes 12 and the wiring electrodes 14, depending on the precision of the device to be mounted, as shown in FIG. 7A.

Figure 7B:
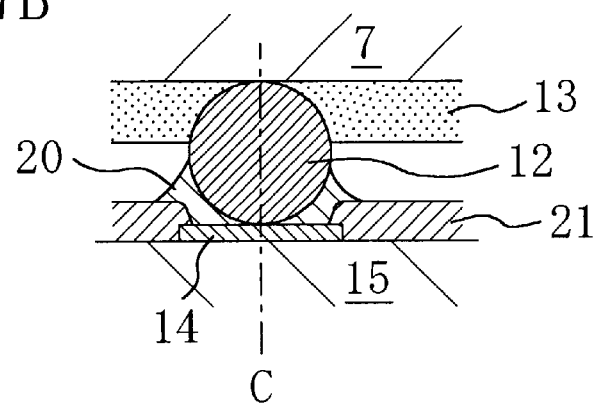

Then, in the self-aligning step S1, when the solder paste 20 is melted, as shown in FIG. 7B, the surface tension of the melted solder paste 20 allows the ball electrodes 12 and the wiring electrodes 14 to be self-aligned in a desired position C.

In this embodiment, the melting point of the solder paste 20 is for example, 150° C. to 200° C., and as shown in FIG. 8, in the self-aligning step S1, the treatment is performed at a temperature equal to or more than the melting point of the solder paste 20 and lower than the melting point of the ball electrodes 12. The melting point of the ball electrodes 12 is for example, 220° C. to 250° C. The softening point of the thermoplastic resin constituting the underfill material layer 13 is 80 to 120° C., and this resin has the properties that it is not carbonized or thermally cured at the melting point of the ball electrodes.

In the structure of this embodiment, the height of the underfill material layer 13 is smaller than that of the ball electrodes 12 so that the ball electrodes 12 are projected from the underfill material layer 13. Therefore, in the stage of the step S1, self-alignment can be realized effectively. To be specific, the portion of the ball electrode 12 projected from the underfill material layer 13 moves in the melted solder paste so that the self-alignment can be realized. Furthermore, the temperature is set to be lower than the melting point of the ball electrodes 12 and higher than the melting point of the solder paste 20, so that the portion of the ball electrode 12 projected from the underfill material layer 13 moves within the melted solder paste without being melted. As a result, the self-alignment can be realized effectively.

Figure 7C:
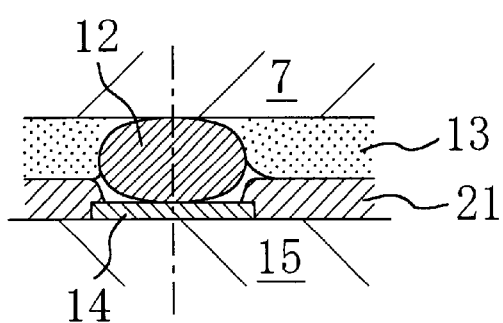
Figure 7D:
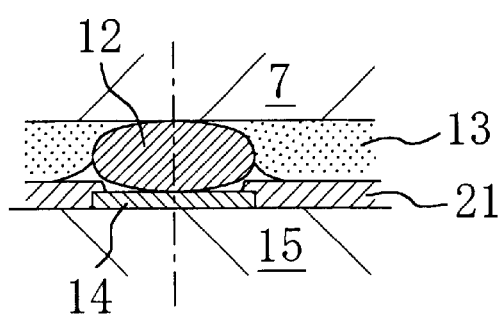

Next, in the ball electrode melting step S2, as shown in FIG. 7C, the ball electrodes 12 are melted, and the semiconductor device (semiconductor chip 7) is pressed into the wiring substrate 15 to bring the under filling material layer 13 into contact with the solder resist 21. Thereafter, in the cooling step S3, the temperature is reduced to about room temperature to cure the underfill material layer 13. Thus, the underfill material is attached. In this manner, the underfill material can be formed efficiently in a mounting member including the semiconductor device and the wiring substrate 15 while obtaining the self-alignment effect.

In this embodiment, the underfill material layer 13 is formed of a thermoplastic resin for the following reason. If the underfill material layer 13 is formed of a thermosetting resin, it is carbonized and cured at a temperature of the melting point of the ball electrodes 12. As a result, the reliability of the underfill material layer 13 serving to support the ball electrodes 12 becomes poor. Furthermore, in the stage shown in FIG. 7C, the resin is already cured, so that when the semiconductor device (semiconductor chip 7) is pressed into the wiring substrate 15, the thickness of the underfill material layer 13 cannot be made small so that the contact between the ball electrodes 12 and the wiring electrodes 14 may be poor. On the other hand, as in this embodiment, if the underfill material layer 13 is formed of a thermoplastic resin, the semiconductor device (semiconductor chip 7 can be pressed into the wiring substrate 15 while the resin (underfill resin) constituting the underfill material layer 13 is soft so that the thickness of the underfill material layer 13 can be reduced. Thus, reliable connection can be established between the ball electrodes 12 and the wiring electrodes 14.

As described above, in the semiconductor device of this embodiment, the contact pads 10 connected to the wiring layer 9 are formed on the elastic layer 8, so that a stress applied to the connection portion due to the difference in the coefficient of thermal expansion between the wiring substrate and the semiconductor device after the device is mounted on the wiring substrate 15 such as a mother board can be absorbed by the elasticity of the elastic layer 8. That is to say, in addition to the structure that can realize a semiconductor device having a high ability of reducing the stress, the underfill material required during substrate mounting is further provided, so that more efficient and more reliable substrate mounting can be realized. Describing this in greater detail, the semiconductor device of this embodiment has a structure that can be formed in a semiconductor wafer form, and is a compact and thin semiconductor device. Moreover, the electrodes are connected not by leads as in the prior art, but by connection with the metal wiring layer 9, so that this is suitable for microprocessing and can be used in a structure with a large number of pins. Furthermore, the wiring layer 9 formed integrally with external electrodes (10) is formed on the elastic layer 8 as the underlying layer, so that the wiring layer 9 can be prevented from being broken and the thermal stress of the external electrodes can be reduced so that the reliability of the junction during substrate mounding can be improved. Above all, since the semiconductor device of the present invention includes the underfill material 13, which is required for substrate mounting, more efficient and more reliable substrate mounting can be realized.

According to the method for producing a semiconductor device of this embodiment, a semiconductor device of high density type in the form of a chip suitable for substrate mounting can be produced. In addition to the advantage that a semiconductor device of high density type in the form of a chip suitable for substrate mounting can be produced, the method of the present invention allows mass production. Moreover, a method for mounting a semiconductor device of this embodiment can realize highly efficient and highly reliable substrate mounting by bringing the semiconductor device having the underfill material layer 13 into contact with the wiring electrodes 14 on the wiring substrate 15 and heating the underfill material.

Preferable examples of the present invention have been described above, but this description does not limit the present invention and there are various modifications.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
    a semiconductor chip having a principal surface provided with a plurality of electrode pads;
    an elastic layer formed on a region excluding the plurality of electrode pads on the principal surface of the semiconductor chip;
    a plurality of contact pads arranged two-dimensionally on the elastic layer on the principal surface of the semiconductor chip;
    a wiring layer electrically connected to at least one of the plurality of electrode pads and electrically connected to at least one of the plurality of contact pads, thereby establishing rewiring connection;
    an insulative resin layer formed on a region excluding the plurality of contact pads on the principal surface of the semiconductor chip;
    a protruded electrode provided on, and protruding from, each of the plurality of contact pads; and
    an underfill material layer provided on the insulative resin layer in such a manner that a top of the protruded electrode is exposed from the underfill material layer;
    wherein the top of the protruded electrode is projected and exposed from the upper surface of the underfill material layer by 1 um to 200 um.

2. The semiconductor device according to claim 1, wherein an upper surface of the underfill material layer is substantially flush with the top of the protruded electrode.

3. The semiconductor device according to claim 1, wherein the protruded electrode is a solder ball.

4. The semiconductor device according to claim 1, wherein the protruded electrode is a solder ball, and the underfill material layer is made of a thermoplastic resin.

5. A semiconductor device comprising:
- a semiconductor chip having a principal surface provided with a plurality of electrode pads;
- an elastic layer formed on a region excluding the plurality of electrode pads on the principal surface of the semiconductor chip;
- a plurality of contact pads arranged two-dimensionally on the elastic layer on the principal surface of the semiconductor chip;
- a wiring layer electrically connected to at least one of the plurality of electrode pads and electrically connected to at least one of the plurality of contact pads, thereby establishing rewiring connection;
- an insulative resin layer formed on a region excluding the plurality of contact pads on the principal surface of the semiconductor chip;
- a protruded electrode provided on, and protruding from, each of the plurality of contact pads; and
- an underfill material layer provided on the insulative resin layer in such a manner that a top of the protruded electrode is exposed from the underfill material layer; wherein a Young's modulus of the elastic layer is 10 to 200 kg/mm$^2$.

6. The semiconductor device according to claim 1, wherein the underfill material layer is an epoxy resin layer.

7. The semiconductor device according to claim 1, wherein an end of the elastic layer has an oblique side in its cross section.

8. The semiconductor device according to claim 5, wherein an upper surface of the underfill material layer is substantially flush with the top of the protruded electrode.

9. The semiconductor device according to claim 5, wherein the protruded electrode is a solder ball.

10. The semiconductor device according to claim 5, wherein the protruded electrode is a solder ball, and the underfill material layer is made of a thermoplastic resin.

11. The semiconductor device according to claim 5, wherein the underfill material layer is an epoxy resin layer.

12. The semiconductor device according to claim 5, wherein an end of the elastic layer has an oblique side in its cross section.

* * * * *